United States Patent [19]

Fisher et al.

[11] Patent Number: 4,871,105

[45] Date of Patent: Oct. 3, 1989

[54] METHOD AND APPARATUS FOR APPLYING FLUX TO A SUBSTRATE

[75] Inventors: John R. Fisher, Langhorne; Leslie A. Guth, Holland, both of Pa.; James A. Mahler, East Windsor, N.J.

[73] Assignee: American Telephone and Telegraph Company, AT&T Bell Laboratories, Murray Hill, N.J.

[21] Appl. No.: 304,522

[22] Filed: Feb. 1, 1989

Related U.S. Application Data

[62] Division of Ser. No. 178,114, Apr. 6, 1988.

[51] Int. Cl.$^4$ .............................................. H05K 3/34
[52] U.S. Cl. ........................................ 228/33; 228/43; 228/37; 239/61; 239/71; 239/403; 239/468
[58] Field of Search ................ 239/61, 70, 71, 74, 239/4, 101, 102.2, 491, 466, 426, 512, 403, 468; 228/43, 51, 57, 18, 33, 35, 37

[56] References Cited

U.S. PATENT DOCUMENTS

| | | | |
|---|---|---|---|
| 3,294,058 | 12/1966 | Shriro | 118/11 |
| 3,999,713 | 12/1976 | Lindsey | 239/426 |
| 4,071,181 | 1/1978 | Plegat | 228/43 |
| 4,125,226 | 11/1978 | Nieuwkamp | 239/468 |
| 4,153,201 | 5/1979 | Berger et al. | 239/102 |
| 4,250,951 | 2/1981 | Mezger et al. | 164/444 |
| 4,301,968 | 11/1981 | Berger et al. | 239/102 |
| 4,337,896 | 7/1982 | Berger et al. | 239/102 |
| 4,346,724 | 8/1982 | Mezger et al. | 134/122 |
| 4,352,459 | 10/1982 | Berger et al. | 239/102 |
| 4,426,041 | 1/1984 | Nieuwkamp et al. | 239/468 |
| 4,540,123 | 9/1985 | Junger et al. | 239/102 |
| 4,541,564 | 9/1985 | Berger et al. | 239/102 |
| 4,558,822 | 12/1985 | Nieuwkamp et al. | 239/403 |
| 4,562,967 | 1/1986 | Grothe et al. | 239/436 |
| 4,625,916 | 12/1986 | Nieuwkamp et al. | 239/431 |
| 4,640,663 | 2/1987 | Niinomi et al. | 414/730 |
| 4,642,581 | 2/1987 | Erickson | 331/154 |
| 4,702,415 | 10/1987 | Hughes | 239/8 |
| 4,708,281 | 11/1987 | Nelson et al. | 228/180.1 |
| 4,713,257 | 12/1987 | Luttermoller | 427/27 |
| 4,723,708 | 2/1988 | Berger et al. | 239/102.2 |

FOREIGN PATENT DOCUMENTS

| | | |
|---|---|---|
| 7626336 | 11/1978 | Fed. Rep. of Germany . |
| 3427004 | 1/1986 | Fed. Rep. of Germany . |
| 55-120472 | 9/1980 | Japan ................................. 228/37 |

OTHER PUBLICATIONS

Sales Literature, Sono-Tek Corporation, 1987.
Sales Literature, WLS Fluxer, Published by Grasmann WLS, 11/87.

*Primary Examiner*—Nicholas P. Godici
*Assistant Examiner*—Michael William Strakweather
*Attorney, Agent, or Firm*—Robert B. Levy

[57] ABSTRACT

A controlled amount of flux is applied to a circuit board (10) by first directing liquid flux through a nozzle (54) containing means for disintegrating the flux into a very fine fog of tiny flux droplets (62). The fog of flux droplets is injected into a laminar gas stream (52), thereby creating a laminar flux stream which is directed at the circuit board to coat the board with flux. As the flux spray is being directed at the circuit board, the concentration of flux solids on the board is being regulated, typically by controlling the rate of flux pumped into the nozzle.

6 Claims, 4 Drawing Sheets

METHOD AND APPARATUS FOR APPLYING FLUX TO A SUBSTRATE

This is a division of application Ser. No. 7-178114 filed Apr. 6, 1988.

TECHNICAL FIELD

This invention relates generally to a technique for fabricating a printed circuit assembly, and more particularly, to a technique for applying a controlled amount of soldering flux to a substrate, such as a printed circuit board, prior to soldering a lead of an electrical component to the board.

BACKGROUND ART

In the electronics industry, solder flux is often applied to a printed circuit board prior to soldering a lead of an electrical component to a corresponding metallized area on the board. The flux serves both as a cleaning and wetting agent to enhance the quality of the solder bond formed between the leads and metallized areas on the board. Typically, the flux is applied by contacting the circuit board with either a liquid wave or a foam of flux, the latter obtained by bubbling a gas through the flux which is made to foam. Alternatively, flux may be applied to the circuit board by brushing or spraying.

Typically, the solder fluxes used within the electronics industry include at least three basic components, a solid (i.e., non-volatile) activator (e.g., an acid), a solid vehicle (e.g., rosin), and a liquid solvent, (e.g., isopropyl alcohol). More recently, solder fluxes have been developed which utilize a water-soluble vehicle, rather than rosin. Such fluxes are referred to as water-soluble fluxes. As compared to rosin-based fluxes, water-soluble fluxes are more chemically active, and generally achieve higher quality solder bonds. Moreover, any flux residues which remain after soldering must be removed from the board by rinsing with water. Notwithstanding the advantages of water-soluble fluxes, a large number of electronics manufacturers still continue to use rosin fluxes because of their unwillingness or their inability to adjust their manufacturing processes or component designs to accommodate water-soluble fluxes.

While rosin-based fluxes dominate the electronics industry, the use of such fluxes is not without problems. Rosin-based fluxes often leave residues on the circuit board after soldering which interfere with testing of the board. For this reason, circuit boards are usually cleaned after soldering. However, rosin residues are difficult to remove, so that harsh industrial detergents or chlorofluourocarbons must be used to clean the circuit board. The disposal of spent industrial detergents is usually expensive while the use of chlorofluourocarbons has been found to be detrimental to the environment.

In an effort to eliminate the need to clean the circuit board after soldering, several manufacturers are presently marketing liquid low-solids fluxes which are so named because they contain small amounts (e.g., 1-5% by weight) of solids (activator and vehicle). Because of the small amount of solids within such fluxes, the amount of residue left on the board is much reduced, as compared to the residues remaining after the use of conventional rosin fluxes. However, even the small level of residues remaining on the circuit board after soldering with low-solids fluxes can be detrimental to the performance and reliability of the circuit board. For example, when low-solids fluxes are applied by conventional methods, such as by a liquid wave or by foaming, brushing or spraying, we have found that the surface insulation resistance of the insulative areas on the board varies widely, often falling below acceptable limits. Reduction in the surface insultation resistance below a particular level may increase the likelihood of electrical short circuits on the board which will likely adversely affect its operation.

Therefore, there is a need for a technique for applying low-solids flux to a circuit board so that the surface insulation resistance of the insulative areas on the board does not decrease below acceptable limits.

BRIEF SUMMARY OF THE INVENTION

Briefly, we have discovered that the surface insulation resistance of the circuit board varies inversely with the concentration of flux solids on the board. Thus, we found that the problem of reduced surface insulation resistance can be avoided by controlling the amount of liquid low-solids flux applied to the circuit board so the concentration of flux solids on the board, as measured in grams/$cm^2$, does not exceed a predetermined value. Conventional flux application techniques (liquid wave, foaming, brushing, or spraying) generally do not permit the flux applied to the circuit board to be well controlled in both uniformity and quantity to avoid the problem of reduced surface insulation resistance. Therefore, a new flux application technique was developed which allowed the volume of low-solids flux applied to the circuit board to be precisely controlled while achieving very good uniformity.

In accordance with the invention, liquid low-solid flux is directed through a nozzle containing means for disintegrating the liquid flux into a fog of very tiny droplets. The fog is then injected into a laminar gas stream to create a laminar flux spray which is directed at the circuit board to uniformly coat the board with flux. The flow rate of flux into the nozzle is regulated to control the volume of flux injected into the gas stream, thereby controlling the volume of flux applied to the circuit board and, hence, the concentration of flux solids which remain after soldering. By maintaining the flux flow rate into the nozzle below a predetermined value, the concentration of flux solids on the circuit board can be maintained below a value at which the surface insulation of the board is adversely affected.

DETAILED DESCRIPTION

Figure 1:
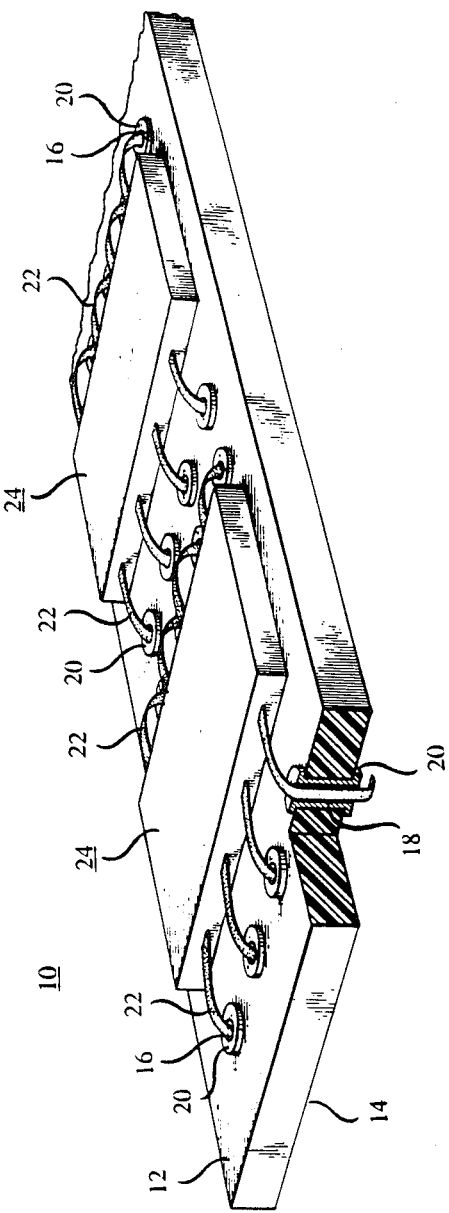
FIG. 1 is a perspective view of a prior art circuit board which has at least one metallized area on a major surface that is solder bonded to a lead of an electronic component.

FIG. 1 is a perspective view of a prior art circuit board 10 which is comprised of a sheet of insulative material (e.g., epoxy resin) having a pair of opposed major surfaces 12 and 14. A plurality of through-holes 16 extend through the circuit board 10 between the surfaces 12 and 14. Each through-hole 16 is plated with a layer of metal 18 which is joined to a pair of metallized areas 20, each located on a separate one of the surfaces 12 and 14 about the hole. Each of a plurality of metallized paths (not shown) is provided on one or both of the surfaces 12 and 14 for connecting a selected pair of metallized areas 20, and hence the metal layers 18 in a selected pair of through-holes 16.

The through-holes 16 are arranged in patterns, each corresponding to the pattern of leads 22 of an electronic component 24. In this way, the leads 22 of each component 24 can be inserted through the corresponding through-holes 16 when the component is placed on the circuit board 10 so as to abut the surface 12. Typically, the leads 22 are of a such a length that after insertion into the through-holes 16, the leads depend from the surface 14 of the circuit board 10.

To assure a solid mechanical and electrical bond between each lead 22 and the metal layer 18 in each corresponding through-hole 16, the lead is soldered to the metal layer. The soldering may be done manually, or preferably, in an automated fashion to increase the rate of circuit board fabrication. One common technique for automated soldering of each lead 22 to the metal layer 18 within each corresponding through-hole 16 is to pass the circuit board 10 over a wave of molten solder (not shown) so the wave contacts the surface 14 of the board. As the solder wave contacts the surface 14, solder is drawn up into each through-hole 16 by wetting forces and thus bonds the lead 22 to the metal layer 18 as well as to the metallized areas 20 in contact with the metal layer.

Prior to soldering, soldering flux is usually applied to the surface 14 of the circuit board 10 so that during the subsequent soldering operation, the solder will wet the leads 22, the metal layer 18 and the metallized areas 20. Typically, the flux is applied to the surface 14 by a liquid flux wave, or by foaming, brushing or spraying. Traditionally, rosin-based fluxes have been used although such fluxes tend to leave flux solids residues on the circuit board 10 after soldering which need to be cleaned to assure reliable testing of the board. To reduce the level of flux solids that remain on the circuit board 10 and hence the need for cleaning, several manufacturers have developed low-solids fluxes, which contain reduced levels of flux solids. As described, one of the problems we found in using low-solids fluxes is that the surface insulation resistance tends to decrease, increasing the probability of electrical short circuits.

In accordance with the invention, we discovered that the surface insulation resistance varies inversely with the concentration of flux solids on the circuit board 10 following flux with low-solids flux. As a consequence, we found that the problem of reduced surface insulation resistance could be substantially eliminated by precisely controlling the amount of low-solid flux applied to the circuit board 10 so that the concentration of flux solids (as measured in grams/cm$^2$) is maintained below a predetermined level. For example, when using Lonco 10 W brand low-solids flux manufactured by London Chemical Co., Bensenville, Illinois, we discovered that by limiting the concentration of flux solids on the circuit board 10 below $7.75 \times 10^{-5}$ grams/cm$^2$, the problem of reduced surface insulation resistance was virtually eliminated. Other low-solids fluxes were also tested with similar results, although the maximum allowable flux solids concentration did vary to some degree, owing to the differences to flux composition.

Once the need to precisely control the amount of flux was discovered, attempts were then made at regulating the amount of flux applied to the circuit board 10 by conventional techniques (e.g., by wave or by foaming, brushing, or spraying). However, conventional flux application techniques did not allow the concentration of flux solids on the circuit board 10 to be uniformly maintained at a sufficiently low level to avoid the problem of reduced surface insulation resistance. Therefore, it was necessary to devise a new technique which would allow the amount of low-solids flux applied to the circuit board 10 to be controlled in a precise fashion.

Figure 2:
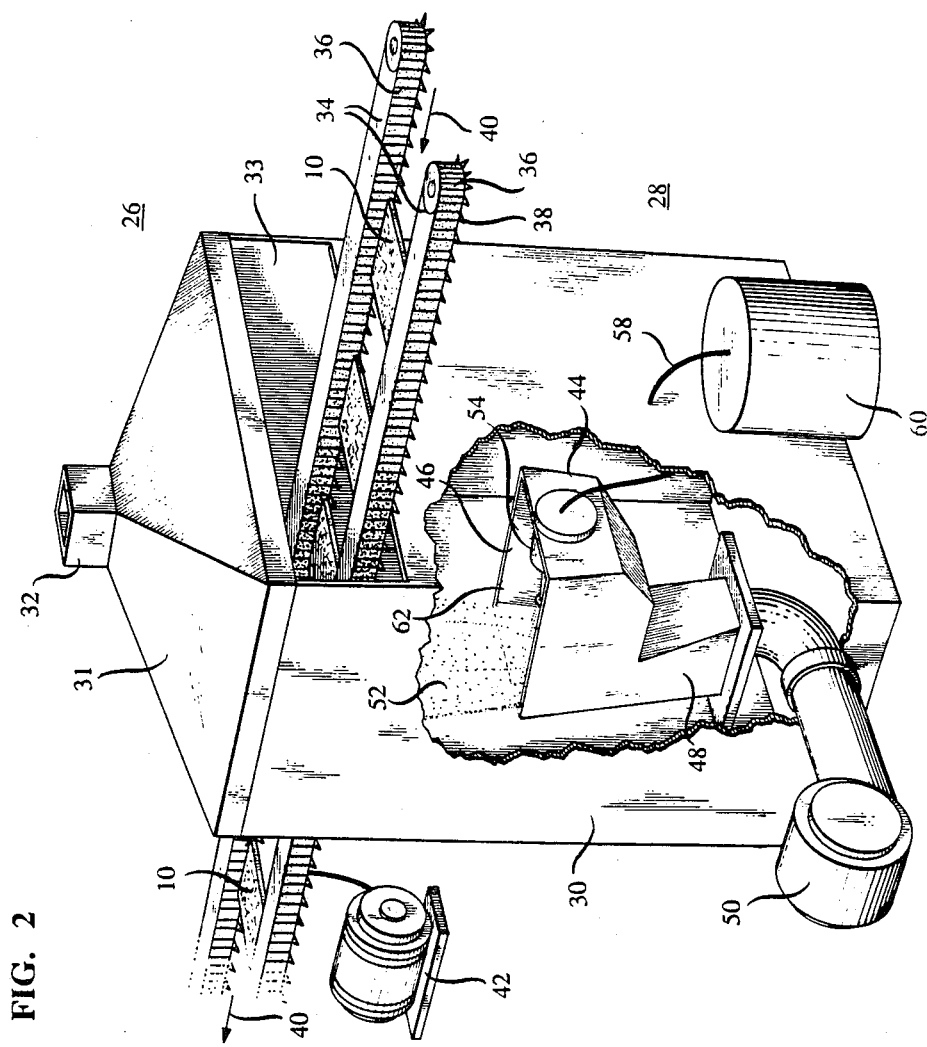
FIG. 2 is a perspective, partially cut away of an apparatus in accordance with the present invention for applying a controlled amount of flux to the circuit board of FIG. 1.
Figure 3:
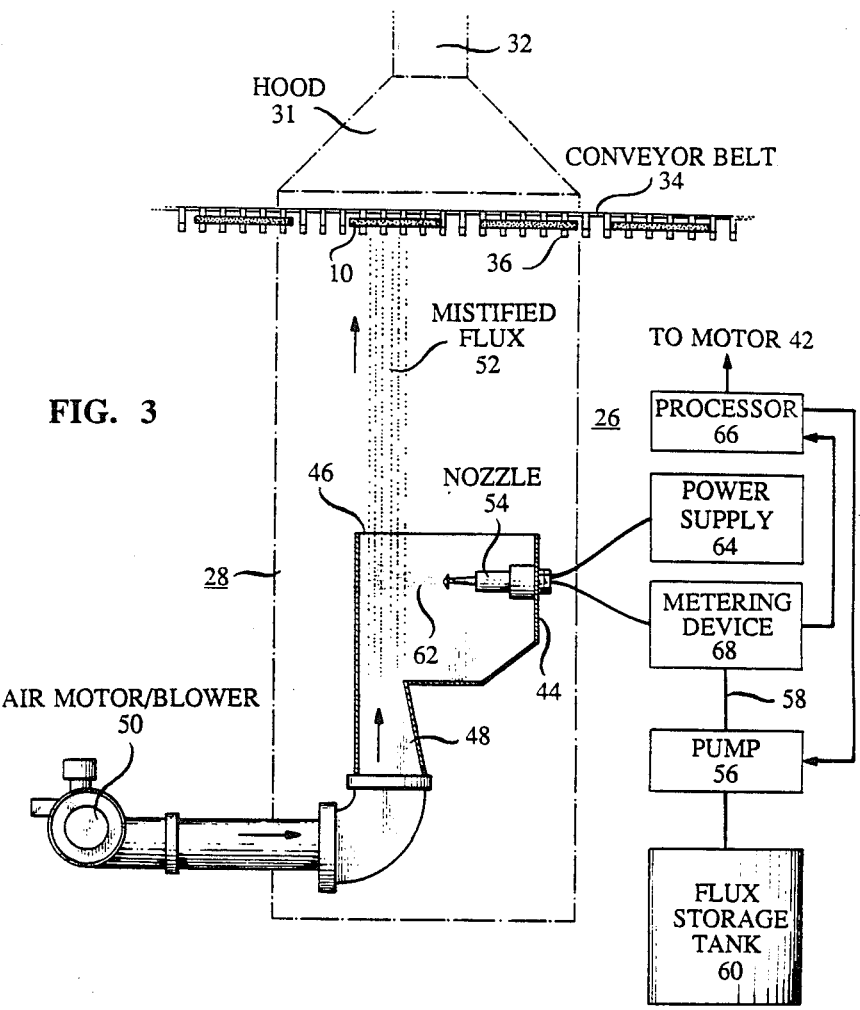
FIG. 3 is a schematic view of the interior of the apparatus of FIG. 2.

FIGS. 2 and 3 are perspective, partially cut away view and a schematic view, respectively, of a fluxing apparatus 26 for applying a controlled amount of flux to the circuit board 10 in accordance with the technique of the present invention. The fluxing apparatus 26 comprises a body 28 formed of four orthogonal vertical walls 30 joined to each other at their lateral edges. The upper end of each wall 30 supports the base of a pyramid-shaped hood 31 which has its vertex coupled to an exhaust vent 32. The hood 31 communicates with the interior of the body 28 and thus serves to direct any upwardly rising vapors within the body into the exhaust vent 32. In this way, vapors within the body 28 are exhausted through the vent 32.

Each of a pair of opposed walls 30 of the body 28 is provided with an opening 33 through which pass a pair of spaced, coplanar conveyor belts 34. The belts 34 each carry a plurality of equally spaced tabs 36. Each tab 36 has a finger 38 at its bottom which projects outwardly from the belt 34 so as to oppose the fingers associated with the tabs carried by the other belt. The fingers 38 serve to engage opposite edges of the circuit board 10 as seen in FIG. 2. The belts 34 are propelled jointly, in a direction indicated by arrow 40, by a variable-speed electric motor 42. When the belts 34 are driven in the direction indicated by the arrow 40, each circuit board 10 is carried through the fluxing apparatus 26 so as to be fluxed in the manner described hereinafter. After leaving the fluxing apparatus 26, each circuit board 10 may be carried by the conveyor belts 34 into a conventional wave-soldering machine (not shown) for soldering.

Figure 5:
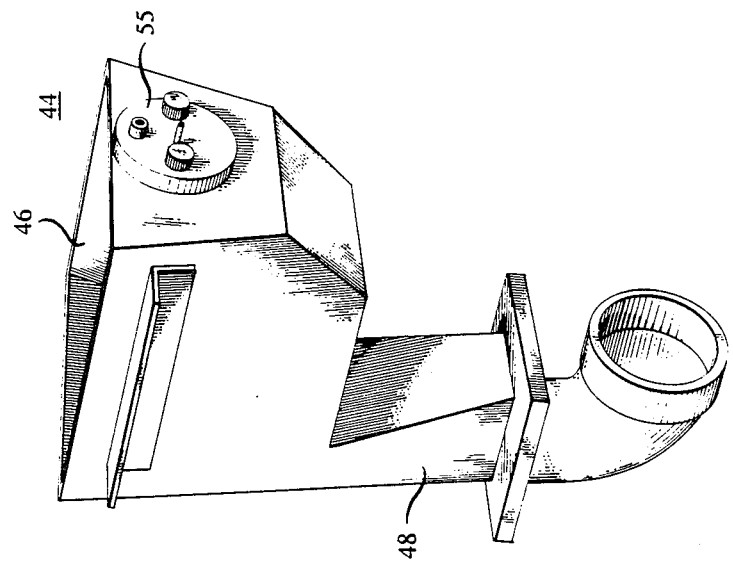
FIG. 5 is another perspective view of the housing seen in FIG. 4.
Figure 4:
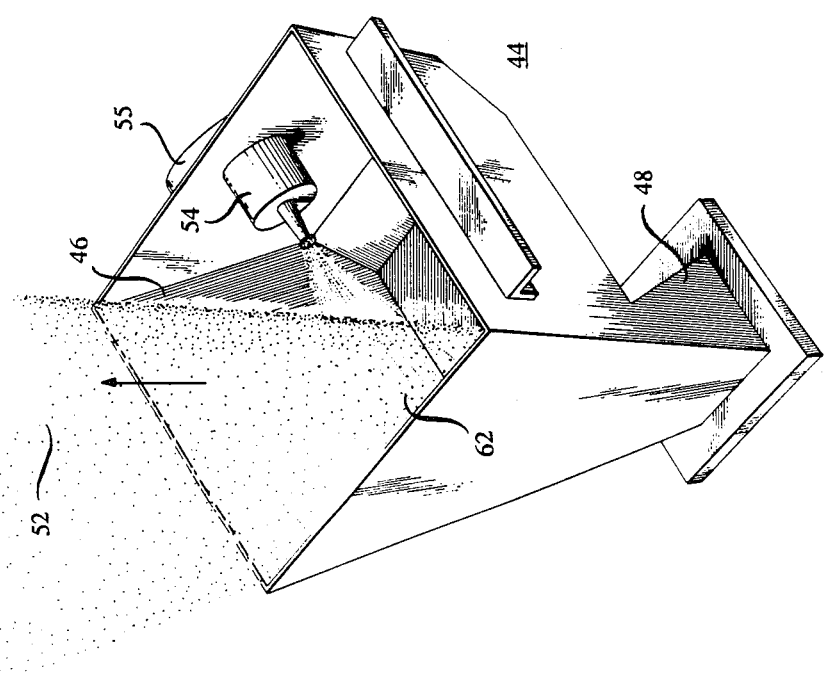
FIG. 4 is a perspective view of a housing within the apparatus of FIGS. 2 and 3.

Referring now to FIG. 3, within the body 28 is a housing 44 which is supported by a stand (not shown). The housing 44 has an open end 46, substantially rectangular in shape, which directly underlies the circuit boards 10 carried through the body 28 by the conveyor belts 34. As seen in FIGS. 3-5, a hollow, tapered throat 48, having a rectangular cross section, is integral with the housing 44 opposite the open end 46. The throat 48 is coupled to a blower 50. (see FIGS. 2 and 3) for carrying a low-velocity gas (e.g., air) into the housing. The taper of the throat 48 and the shape of the opening 46 are such that the air entering the housing 44 from the throat exits the opening in a laminar divergent stream 52 having a good uniformity.

Mounted within the housing 44 is a nozzle 54, which, as seen in FIGS. 4 and 5, is secured to the housing by a bracket 55. Liquid, low-solid flux such as Lonco 10W brand flux, is pumped into the nozzle 54 by a variable-speed pump 56 through a line 58 from a flux storage tank 60. Within the nozzle 54 are means (not shown), typically taking the form of a set of spaced piezoelectric crystals, for ultrasonically disintegrating the liquid flux pumped through the nozzle into a very fine mist or fog 62 of flux droplets which is injected into the stream 52. Referring to FIG. 3, the piezoelectric crystals within the nozzle 54 are excited by an adjustable power supply 64. In a preferred embodiment, the nozzle 54 takes the form of a model 8700 nozzle manufactured by Sono-Tek, Poughkeepsie, N.Y. The power supply 64 as well as the housing 44 are commercial items manufactured by Sono-Tek.

The fluxing apparatus 26 further includes a processor 66, typically taking the form of a model EMO 1005 processor made by A. W. Company of Racine, Wis. The processor 66 is coupled to the pump 56 and to a flow meter 68 interposed within the line 58 for measuring the rate of flux flow through the line. Data from the flow meter 68, indicative of the rate of flux flow through the line 58, is used by the processor 66 to regulate the speed of the pump 56 to maintain a predetermined rate of flux flow. Alternatively, regulation of the flow rate of flux through the line 58 can be achieved by controlling the pump 56 in accordance with its actual speed, provided that the amount of flux pumped at a given speed is known. In addition to controlling the pump 56, the processor 66 also controls the motor 42 (See FIG.1) which drives the conveyor belts 32. Altering the speed of the conveyor belts 32 does, however, impact subsequent soldering operations performed on the board 10. For this reason, it is preferable to control the amount of flux solids on the circuit board 10 by controlling the rate of flux flow.

In operation, as flux is pumped by the pump 56 through the nozzle 54, the flux is disintegrated into the mist 62 which then is injected into the stream 52 which now becomes a flux spray. The stream (spray) 52 is directed upwardly at the surface 14 of each circuit board 10 and serves to coat the surface with flux. The laminar nature of the stream 52, as well as its very narrow dispersion, assures that the surface 14 is coated uniformly with flux.

The concentration of the flux solids applied to the surface 14 is dependent upon both the rate at which flux is pumped through the nozzle 54 and the speed of the conveyor belts 34. For a given speed of the conveyor belts 34, increasing the rate of flux pumped through the nozzle 54 causes an increase in the concentration of the flux solids on the surface 14 of the circuit board 10. If the flux flow rate remains constant, then, as the speed of the conveyor belts 34 increases, the concentration of the flux solids on the surface 14 decreases. The processor 66 controls both the speed of the pump 56 and the speed of the conveyor belt 34 to maintain the concentration of flux solids on the surface 14 below a predetermined value. When using Lonco Brand 10W, it was found that a flow rate of 20–60 millileters/minute and a conveyor speed of 1.22–2.44 meters/minute allowed the concentration of flux solids on the surface 14 of the circuit board 10 to be maintained below $7.75 \times 10^5$ gms/cm$^2$. The use of other brands of liquid low-solid flux may require adjustment of either the conveyor speed or the flux flow rate or both to limit the concentrations of flux solids to avoid adversely affecting the surface insulation resistance.

The foregoing describes a technique for precisely controlling the amount of flux applied to the circuit board 10 to limit the concentration of flux solids thereon so the surface insulation resistance of the board is not adversely affected. As compared to conventional flux applications techniques, the technique of the present invention affords several advantages. First and foremost, the instant technique relies on closed-loop control of the rate of flux flow. As described, the processor 66 of the fluxing apparatus 26 adjusts the rate of flux flow in accordance with the actual rate of flux flow, as sensed by the flow meter 68. The closed-loop control of flux afforded by the apparatus 26 achieves far better control of the amount of flux solids on the circuit board 10 than to conventional fluxing apparatus which typically employ open loop control.

Secondly, the laminar nature and narrow dispersion of the stream 52 assure a far greater uniformity of flux deposition than may be achievable by conventional flux application techniques. Moreover, we have found that the flux application technique results in virtually no puddling of flux on the circuit board 10, even when the board is warped. In contrast, conventional flux application techniques often leave puddles of flux, particularly in the areas where the circuit board 10 is warped.

An additional advantage of the instant fluxing technique is that when flux is applied to the surface 14 of the circuit board 10, there is very little contamination of the top surface 12. In contrast, when flux is applied to the circuit board 10 by conventional techniques, the flux is usually forced through the through-holes 16 so that the flux contaminates the surface 12.

Yet another advantage of the fluxing apparatus 26 is that the amount of solvent loss from the flux is reduced because the flux is not exposed until actual application to the circuit board 10. In contrast, with conventional flux application techniques, the flux tends to be exposed to the atmosphere continuously, leading to the evaporation of the solvent in the flux. As a result, the concentration of flux solids tends to increase. Thus, with conventional flux application techniques, control of the flux density is required. The need for controlling the flux density is obviated by the fluxing apparatus 26 of the present invention.

It should be understood that the above-described embodiments are merely illustrative of the principles of the invention. Various modifications and changes may be made thereto by those skilled in the art which will embody the principles of the invention and fall within the spirit and scope thereof. For example, while the fluxing apparatus 26 produces an upwardly directed stream 52 of flux directed at the bottom surface 14, the apparatus could be easily modified so that the flux stream is directed downward towards the top surface 12 of the circuit board 10.

What is claimed is:

1. Apparatus for applying a controlled amount of liquid low-solids flux to a circuit board, CHARACTERIZED BY;
   means for producing a laminar gas stream;
   means for pumping liquid low-solids flux from a storage tank;
   means, coupled to said flux pumping means, for disintegrating the liquid low-solids flux into a fog of tiny flux droplets and for injecting said droplets into said stream;
   means for directing said stream containing said flux droplets towards a circuit board to coat the board with flux;
   means for indicating the concentration of flux solids on the circuit board; and
   means, responsive to said indicating means, for adjusting the concentration of flux solids on the circuit board to achieve a uniform coating which does not exceed a predetermined concentration of flux solids.

2. The apparatus according to claim 1, CHARACTERIZED IN THAT;
said apparatus further includes means for imparting relative motion at an adjustable speed between the circuit board and the spray-directing means to cause said circuit board to be substantially uniformly coated with flux.

3. The apparatus according to claim 8, CHARACTERIZED IN THAT
said means for adjusting the concentration of flux solids on the circuit board comprises:
means for metering the flux pumped through said disintegrating means and for providing data indicative of the flux flow rate; and said adjusting means comprises
processor means for controlling said pump means in accordance with the data provided by said metering means.

4. The apparatus according to claim 9, CHARACTERIZED IN THAT said means for controlling the flux concentration on the circuit board comprises means for controlling the speed of the relative motion imparted between the circuit board and the spray-directing means.

5. The apparatus according to claim 9, CHARACTERIZED IN THAT said means for adjusting the concentration of flux on the circuit board comprises:
means for metering the flow of flux into said disintegrating means and for providing data indicative of the rate of flow of flux; and said adjusting means comprises
processor means coupled to said metering means and to said means for imparting said relative motion, for controlling the rate of flux flow in accordance with said data from said metering means and for controlling the speed of the relative motion between the circuit board and the spray-directing means.

6. The apparatus according to claim 1, CHARACTERIZED BY means for exhausting vapors arising from directing the flux spray towards the board.

* * * * *

UNITED STATES PATENT AND TRADEMARK OFFICE
CERTIFICATE OF CORRECTION

PATENT NO.  : 4,871,105

DATED       : October 3, 1989

INVENTOR(S) : J. R. Fisher, L. A. Guth, J. A. Mahler

It is certified that error appears in the above-identified patent and that said Letters Patent is hereby corrected as shown below:

Column 2, line 55, "flux" should read --fluxing--.

Column 5, line 56, "$10^5$ gms" should read --$10^{-5}$ gms--.

Column 5, line 50, "belt" should read --belts--.

Claim 3, column 7, line 10, "claim 8" should read --claim 1--.

Claim 4, column 7, line 21, "claim 9" should read --claim 2--.

Claim 5, column 8, line 5, "claim 9" should read --claim 2--.

Signed and Sealed this

Thirteenth Day of November, 1990

*Attest:*

HARRY F. MANBECK, JR.

*Attesting Officer*   *Commissioner of Patents and Trademarks*